United States Patent
Koche et al.

(10) Patent No.: US 12,314,648 B2
(45) Date of Patent: May 27, 2025

(54) REMOTE PROGRAMMING SYSTEMS AND METHODS FOR PROGRAMMABLE LOGIC DEVICES

(71) Applicant: Lattice Semiconductor Corporation, Hillsboro, OR (US)

(72) Inventors: Rahulkumar Koche, Hillsboro, OR (US); Satwant Singh, Fremont, CA (US); Bertrand Leigh, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 744 days.

(21) Appl. No.: 17/614,316

(22) PCT Filed: May 28, 2020

(86) PCT No.: PCT/US2020/035000
§ 371 (c)(1),
(2) Date: Nov. 24, 2021

(87) PCT Pub. No.: WO2020/243367
PCT Pub. Date: Dec. 3, 2020

(65) Prior Publication Data
US 2022/0229411 A1    Jul. 21, 2022

Related U.S. Application Data

(60) Provisional application No. 62/854,164, filed on May 29, 2019.

(51) Int. Cl.
*G06F 30/34* (2020.01)
*G05B 19/05* (2006.01)
*G06F 15/78* (2006.01)

(52) U.S. Cl.
CPC .......... *G06F 30/34* (2020.01); *G06F 15/7871* (2013.01); *G05B 19/054* (2013.01); *G05B 2219/13109* (2013.01)

(58) Field of Classification Search
None
See application file for complete search history.

(56) References Cited

U.S. PATENT DOCUMENTS

| | | |
|---|---|---|
| 6,205,579 B1 | 3/2001 | Southgate |
| 6,481,001 B1 | 11/2002 | Moore |

(Continued)

FOREIGN PATENT DOCUMENTS

| | | |
|---|---|---|
| WO | WO 2016/007563 A1 | 1/2016 |
| WO | WO 2019/067644 A1 | 4/2019 |
| WO | 2020243367 A1 | 12/2020 |

OTHER PUBLICATIONS

International Search Report and Written Opinion in International Application No. PCT/US2020/035000 dated Sep. 3, 2020, 7 pages.

(Continued)

*Primary Examiner* — Leigh M Garbowski
(74) *Attorney, Agent, or Firm* — Haynes and Boone, LLP

(57) ABSTRACT

Systems and methods for management of remotely programmable, programmable logic devices (remote PLDs) are disclosed. An example system includes a remote PLD including a plurality of programmable logic blocks (PLBs) arranged in a PLD fabric and a programmable input/output (I/O) coupled to the PLD fabric. The remote PLD is configured to form a communications link between the remote PLD and a remote PLD management system node over a communications network via a communication module of the remote PLD or a host device configured to interface with the remote PLD over the programmable I/O. The remote PLD is configured to receive a protected configuration image from the remote PLD management system node over (Continued)

the communications link and programs the PLD fabric according to the protected configuration image.

20 Claims, 7 Drawing Sheets

(56) References Cited

U.S. PATENT DOCUMENTS

| | | | |
|---|---|---|---|
| 7,133,822 B1* | 11/2006 | Jacobson | G06F 11/366 |
| | | | 716/117 |
| 7,711,964 B2 | 5/2010 | Van Essen et al. | |
| 10,635,687 B2* | 4/2020 | Young | G06Q 10/0833 |
| 10,685,155 B2* | 6/2020 | Wang | G06F 9/5066 |
| 11,088,981 B2* | 8/2021 | Young | H04L 51/066 |
| 11,765,123 B1* | 9/2023 | Young | H04L 51/066 |
| | | | 709/245 |
| 2016/0117162 A1* | 4/2016 | Searle | H04L 41/082 |
| | | | 717/173 |
| 2017/0339116 A1 | 11/2017 | Atsatt | |
| 2019/0095505 A1* | 3/2019 | Young | G06Q 10/0833 |

OTHER PUBLICATIONS

R. Kumar, R. C. Joshi and K. S. Raju, "A FPGA Partial Reconfiguration Design Approach for RASIP SDR," 2009 Annual IEEE India Conference, 2009, pp. 1-4, doi: 10.1109/INDCON.2009.5409354.

Y. H. Yoon et al., "Remote In-System Reconfiguration for Automotive Device," 2019 IEEE International Conference on Consumer Electronics (ICCE), 2019, pp. 1-2, doi: 10.1109/ICCE.2019.8661945.

Anonymous, "Download-Wikipedia", May 28, 2019, pp. 1-3. [URL: https://en.wikipedia.org/w/index.php?title=Download&oldid=899176801].

International Search Report and Written Opinion in International Application No. EP20814342, dated Mar. 17, 2023, 11 pages.

* cited by examiner

REMOTE PROGRAMMING SYSTEMS AND METHODS FOR PROGRAMMABLE LOGIC DEVICES

CROSS REFERENCE TO RELATED APPLICATIONS

This application is a U.S. national stage filing under 35 U.S.C. § 371 of International Patent Application No. PCT/US2020/035000 filed May 28, 2020 and entitled "REMOTE PROGRAMMING SYSTEMS AND METHODS FOR PROGRAMMABLE LOGIC DEVICES," claims the benefit of and priority to U.S. Provisional Patent Application No. 62/854,164 filed May 29, 2019 and entitled "REMOTE PROGRAMMING SYSTEMS AND METHODS FOR PROGRAMMABLE LOGIC DEVICES," all of which are incorporated herein by reference in their entirety.

TECHNICAL FIELD

The present invention relates generally to programmable logic devices and, more particularly, to remote management of memory, communication interfaces, and/or other assets of such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

Manufacturers of host devices including PLDs often dedicate considerable resources to developing configurations for their chosen PLD type and/or capability and typically benefit in terms of perceived customer satisfaction by providing continuing device support after the host devices have been sold and/or deployed. Thus, there is a need in the art for systems and methods to manage PLD configurations remotely and securely, particularly in the context of computing applications and computing architectures that are otherwise difficult for a user to manage manually.

Figure 1:
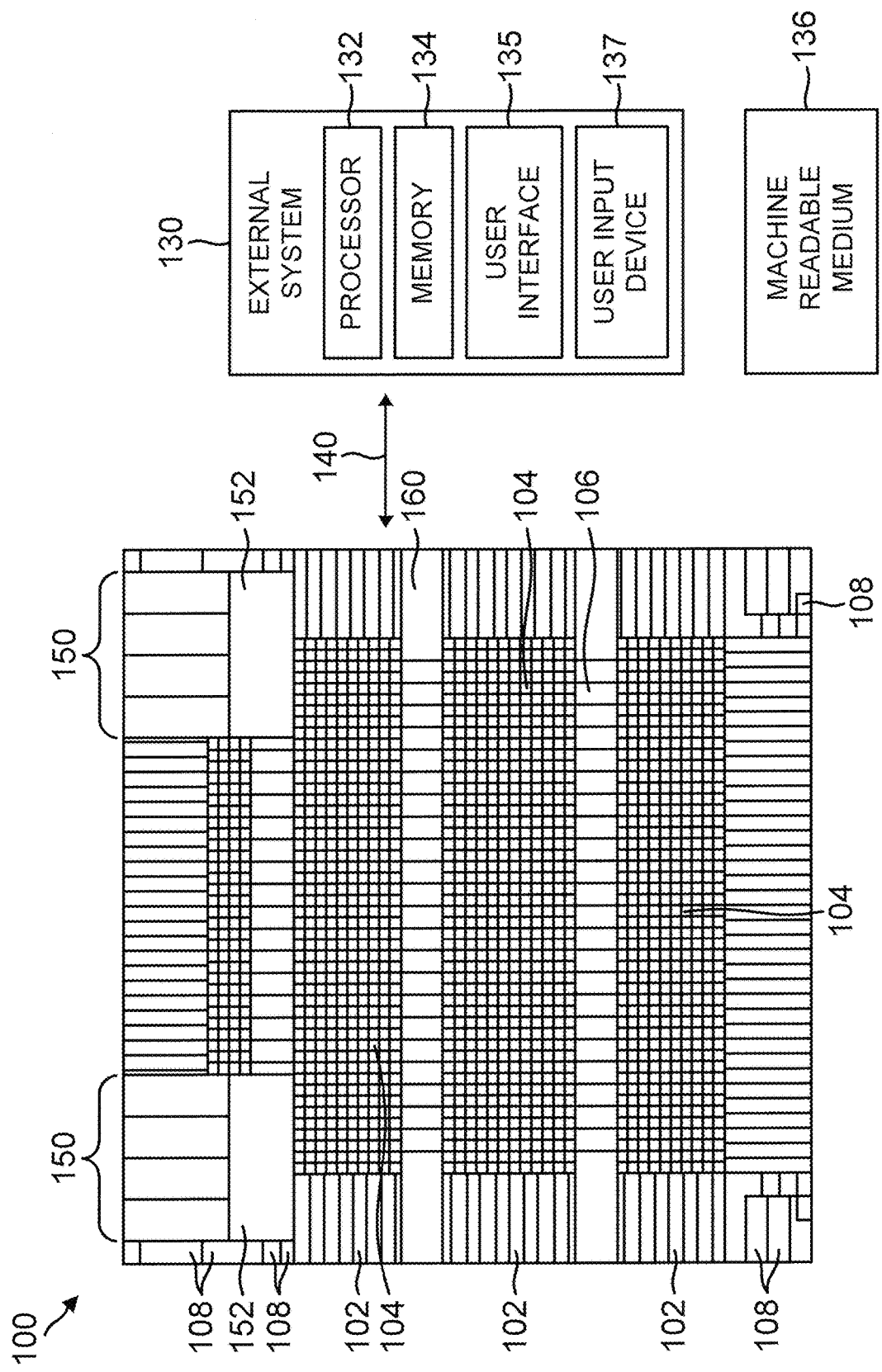
FIG. 1 illustrates a block diagram of a programmable logic device (PLD) in accordance with an embodiment of the disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for managing internal and external assets (e.g., fabrics, buses, ports, and/or memory sectors) of a remotely programmable logic device (a "remote PLD" or "remotely programmable PLD," as used interchangeably herein) for use in various host devices for computing applications and architectures, as described herein. For example, embodiments provide systems and methods for managing remote provisioning, reprovisioning (e.g., updating), and debugging of individual assets and/or groupings of assets of a remote PLD by remotely programming the remote PLD (e.g., over a wired and/or wireless network) with a configuration image/configuration data, which may itself be protected according to a publisher-defined configuration and/or operating context, to help reduce or eliminate risk of loss or extraction of a publisher's data, or reprogramming of such data.

In accordance with embodiments set forth herein, techniques are provided to manage implementation of user designs in PLDs generally, and more specifically, in remote PLDs. In various embodiments, a user design may be converted into and/or represented by a set of PLD components (e.g., configured for logic, arithmetic, or other hardware functions) and associated interconnections available in a PLD. For example, a PLD may include a number of programmable logic blocks (PLBs), each PLB including a number of logic cells, and a variety of configurable routing resources that may be used to interconnect the PLBs and/or logic cells. In some embodiments, each PLB may be implemented with between 2 and 16 or between 2 and 32 logic cells.

In general, a PLD fabric includes one or more routing structures and an array of similarly arranged logic cells arranged within programmable function blocks (e.g., PFBs and/or PLBs). The purpose of the routing structures is to programmably connect ports of the logic cells/PLBs to one another in such combinations as necessary to achieve an intended functionality. Routing flexibility and configurable function embedding may be used when synthesizing, mapping, placing, and/or routing a user design into a number of PLD components. As a result of various user design optimization processes, which can incur significant design time and cost, a user design can be implemented relatively efficiently, thereby freeing up configurable PLD components that would otherwise be occupied by additional operations and routing resources. In some embodiments, an optimized user design may be represented by a netlist that identifies various types of components provided by the PLD and their associated signals. In embodiments that produce a netlist of the converted user design, the optimization process may be performed on such a netlist. Once optimized, such configuration may be used to program a PLD directly, for example, or may be encrypted and signed and/or otherwise secured for distribution to a remote PLD, and such process may include one or more key provisioning processes, as described herein. A "remote PLD" may differ from a more generic PLD by including various additional "hard" engines or modules configured to provide a range of remote management functionality that may be linked to operation of the PLD fabric to provide configurable computing functionality and/or architectures, as described herein.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). More generally, the individual elements of PLD 100 may be referred to as a PLD fabric.

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
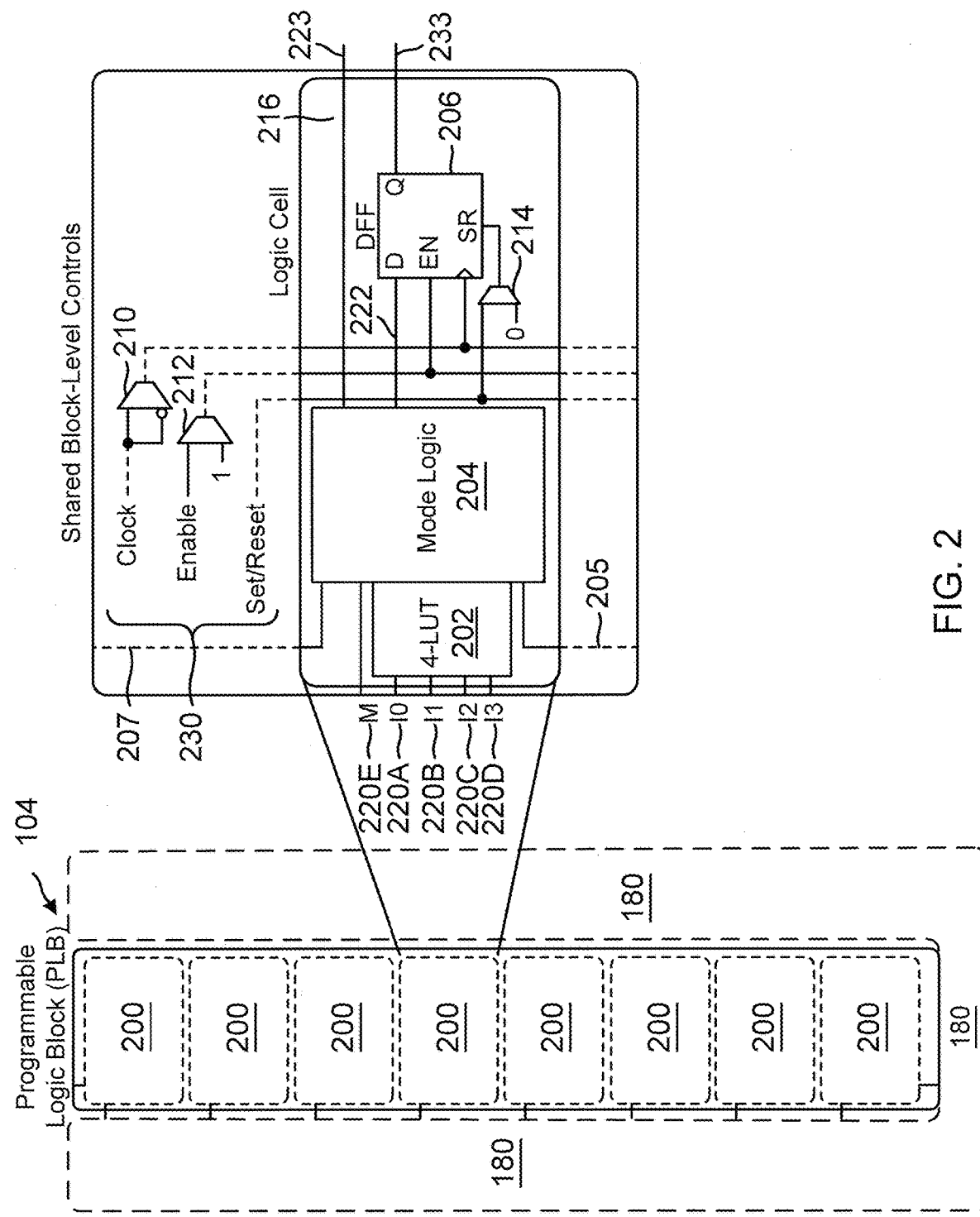
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality. In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode Logic 204 may include various logic elements and/or additional inputs, such as input 220E, to support the functionality of various modes, as described herein. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers, as described herein. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200, fewer logic blocks 104, and/or with less burden on routing resources 180 when PLD 100 is configured to implement the user design. Such adjustments according to various embodiments may identify certain logic, arithmetic, and/or extended logic operations, to be implemented in an arrangement occupying multiple embodiments of logic cells 200 and/or logic blocks 104. As further described herein, an optimization process may route various signal connections associated with the arithmetic/logic operations described herein, such that a logic, ripple arithmetic, or extended logic operation may be implemented into one or more logic cells 200 and/or logic blocks 104 to be associated with the preceding arithmetic/logic operations.

Figure 3:
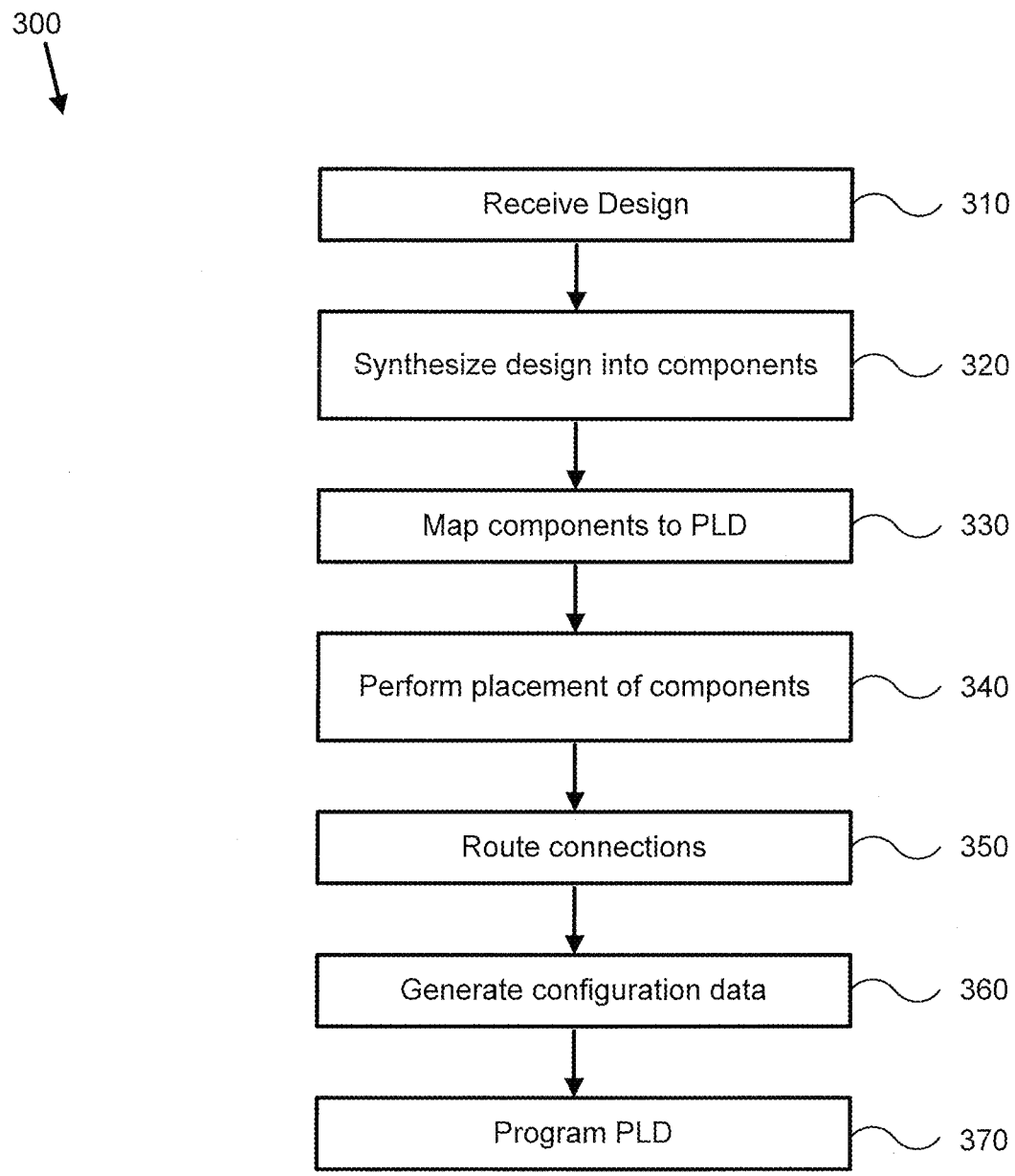
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise. In various embodiments, such files and/or information may be encrypted or otherwise secured when stored and/or conveyed to PLD 100 and/or other devices or systems.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components), which may include both programmable components and hard IP components of PLD 100. In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In an additional example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In an additional example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In various embodiments, such configuration data may be encrypted, signed, and/or otherwise protected as part of such generation process, as described more fully herein. In operation 370, system 130 configures PLD 100 with the configuration data by, for example, loading a configuration data bitstream (e.g., a "configuration" or "configuration image") into PLD 100 over connection 140. Such configuration may be provided in an encrypted, signed, or unsecured/unauthenticated form, for example, and PLD 100 may be configured to treat secured and unsecured configurations differently, as described herein. Moreover, PLD 100 may be implemented as a remote PLD and connection 140 may include one or more wired and/or wireless networks and/or communications links disposed between PLD 100 and system 130, as described more fully herein with respect to FIGS. 4-7.

Figure 4:
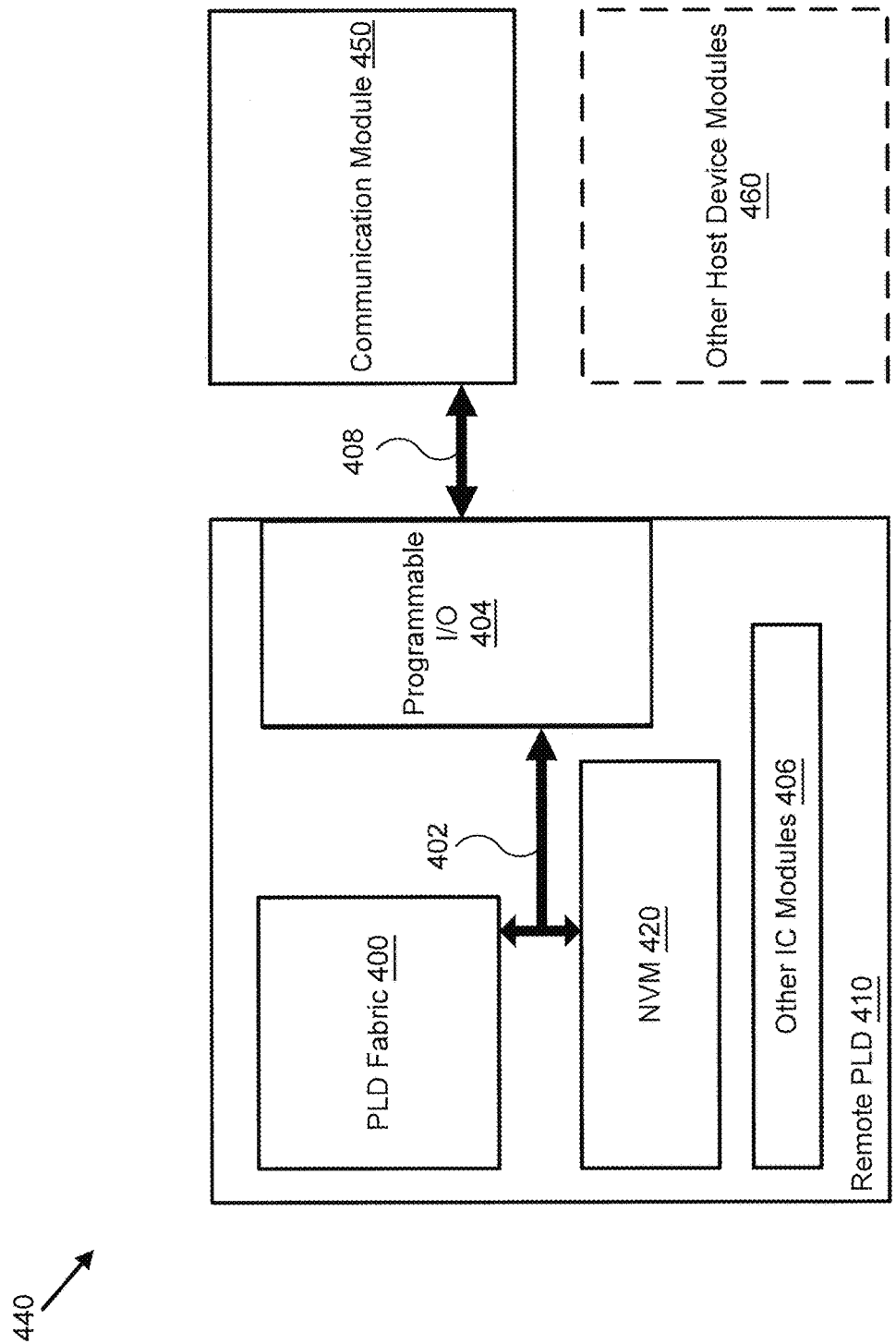
FIG. 4 illustrates a block diagram of a host device including a remote PLD in accordance with an embodiment of the disclosure.

FIG. 4 illustrates a block diagram of a host device 440 including a remote PLD 410 in accordance with an embodiment of the disclosure. In various embodiments, remote PLD 410 may be implemented by elements similar to those described with respect to PLD 100 in FIG. 1, but with additional configurable and/or hard IP elements configured to facilitate operation and/or remote programming of or communication with remote PLD 410 within a particular computing application and/or architecture, such as host device 400, as described herein.

For example, as shown in the embodiment illustrated in FIG. 4, remote PLD 410 may include a PLD fabric 400 linked by various buses to a non-volatile memory (NVM) 420, a programmable I/O 404, and/or other integrated circuit (IC) modules 406, which may all be implemented on a monolithic IC, as shown. More generally, PLD fabric 400 may be implemented by any of the various elements described with respect to PLD 100 and may be configured using a design process similar to design process 300 described in relation to FIG. 3 to generate and program PLD fabric 400 according to a desired configuration. In particular, remote PLD 410 may be configured to use various hard IP elements identified in FIG. 4 to receive, decrypt, authenticate, and/or verify a received configuration prior to programming PLD fabric 400 according to the received configuration, for example, or to otherwise communicate with a management system for remote PLD 410, as described herein.

In various embodiments, host device 440 may include communication module 450 and/or other host device modules 460 that may be coopted by remote PLD 410 and configured to facilitate remote management of remote PLD 410, for example, or to facilitate a particular host device application, as described herein. Host device 440 may be implemented as a smart phone, a laptop computer, a tablet computer, a desktop computer, a smart environmental sensor, a home automation device (e.g., sensor and/or actuator), a deployed but otherwise unattended equipment controller module (e.g., for a mountaintop weather station, unmanned farm equipment, solar powered/unmanned aircraft and watercraft), and/or as a variety of other host devices, for example, that are able to interface with remote PLD 410, as described herein.

NVM 420 may be implemented as a hard IP resource configured to provide securable non-volatile storage of data used to facilitate operation of remote PLD 410. NVM 420 may include multiple differentiated sectors, such as one or more configuration image sectors, a device key sector (e.g., an AES key sector and a separate public key/key pair sector), a user flash memory (UFM) sector, and/or other defined storage sectors. Configuration image sectors may each store a configuration for PLD fabric 400, for example, so as to allow them to be selected (e.g., based on version or date) and used to program PLD fabric 400. A trim sector may be used to store manufacturer trim, device identifier, device category identifier, and/or other data specific to a particular remote PLD 410, for example, such as a modifiable customer-specific ordering part number and/or a generated customer ID number. Device key sectors may be used to store encryption/decryption keys, public/private keys, and/or other security keys specific to a particular remote PLD 410. UFM sectors may be used to store user data generally accessible by PLD fabric 400, such as configurations or application-specific security keys, certificates, and/or other secure(d) user data. Any one or more individual elements, portions, or sectors of NVM 420 may be implemented as configurable memory, for example, or one-time programmable (OTP) memory, as described herein.

Programmable I/O 404 may be implemented as at least partially configurable resources and/or hard IP resources configured to provide or support a communications link between PLD fabric 400 and an external controller, memory, and/or other device, such as communication module 450, for example, across bus 402 (e.g., an internal and/or integrated communications bus configured to link portions of PLD fabric 400 to programmable I/O 404, NVM 420, and/or other elements of remote PLD 410) and according to one or more external bus interfaces and/or protocols 408. Programmable I/O 404 may also be configured to support communications between PLD fabric 400 and/or NVM 420 across bus 402 and/or external bus interface/protocol 408 with communication module 450 and/or other elements of host device 440, for example, in addition or as an alternative to external system130/machine readable medium 136, as described herein. In some embodiments, bus 402 and/or programmable I/O 404 may be integrated with PLD fabric 400. More generally, one or more elements of remote PLD 410 shown as separate in FIG. 4 may be integrated with and/or within each other.

Other IC modules 406 may be implemented as hard and/or configurable IP resources configured to facilitate operation of remote PLD 410. For example, other IC modules 406 may include a security engine implemented as a hard IP resource configured to provide various security functions for use by PLD fabric 400 and/or host device 440. Other IC modules 406 may also include a configuration engine implemented as a hard IP resource configured to manage the configurations of and/or communications amongst the various elements of remote PLD 410, including to manage or control configurations of elements of remote PLD 410, boot of PLD fabric 400, and flow control throughout remote PLD 410. In some embodiments, other IC modules 406 may include one or more communication modules (e.g., similar to communication module 450 of host device 440) that are integrated with remote PLD 410 and that can perform various operations or subsets of operations to form and/or manage communications links over wired and/or wireless networks, as described herein.

In further embodiments, other IC modules 406 may include one or more additional external access busses implemented according to one or more of a JTAG, I2C, SPI, and/or other external access bus or protocol, for example, configured to provide access to and/or from communication module 450 and/or other host device modules 460. For example, although shown in FIG. 4 as integrated as a hard IP resource within remote PLD 410, NVM 420, or a similar additional hard IP resource may be integrated with host device 440 (e.g., as other host device modules 460) and accessible (e.g., by PLD fabric 400 and/or other elements of remote PLD 410) over internal bus 402, external bus interface/protocol 408, and/or any one or combination of such external access buses or protocols.

In various embodiments, communication module 450 may be implemented as a network communications IC configured to form communications links to a remote external device (e.g., over one or more wired and/or wireless networks) used to manage operation of remote PLD 410. For example, in some embodiments, communication module 450 may be implemented as a wireless communication module configured to support a wireless communications link (e.g., formed according to WiFi, Bluetooth, Zigbee, Zwave, near-field communication (NFC), cellular, and/or other open and/or proprietary wireless communication protocols) to a communications network and, thereby, to a remote PLD management system or a PLD configuration broker of such remote PLD management system that is communicatively coupled to such communications network, as described herein. In such embodiments, communication module 450 may be configured to manage various security features of such wireless communications link (e.g., establishing communications link credentials, employing communications link credentials to establish a wireless communications link, negotiating encryption keys for encrypted communications tunnels established over such wireless communications link, such as transport layer security (TLS)), for example, and/or may be configured to be controlled by remote PLD 410 and/or other host device modules 460 to manage such security features. In particular, remote PLD 410 may be configured to take control of operation of communication module 450, superseding control otherwise by host device 440, over external bus interface/protocol 408 and/or other external bus interface/protocol implemented by remote PLD 410 and/or host device 440.

Other host device modules 460 may include various computing, sensor, and/or actuator elements configured to implement a particular host device application, for example, such as a remote sensor application, a remote controller application, and/or a remote computing application, as described herein. Other host device modules 460 may also include various other communication buses, power storage and delivery elements, user interfaces (e.g., buttons, keyboard, mouse, track pad, and/or displays/touch screen displays) to support such host device applications. In one embodiment, other host device modules 460 includes an electrical characteristic sensor configured to detect and/or measure an electrical state of transducer element (e.g., also an element of other host device modules 460) that is used to measure an environmental condition associated with host device 440. In another embodiment, other host device modules 460 includes various electronic devices typically found within a smart phone, a laptop computer, a tablet computer, and/or a desktop computer, for example, and/or within a smart environmental sensor, a home automation device (e.g., sensor and/or actuator), an equipment controller module, an unmanned aircraft or watercraft, various types of industrial equipment, and/or other host devices, as described herein.

Figure 5:
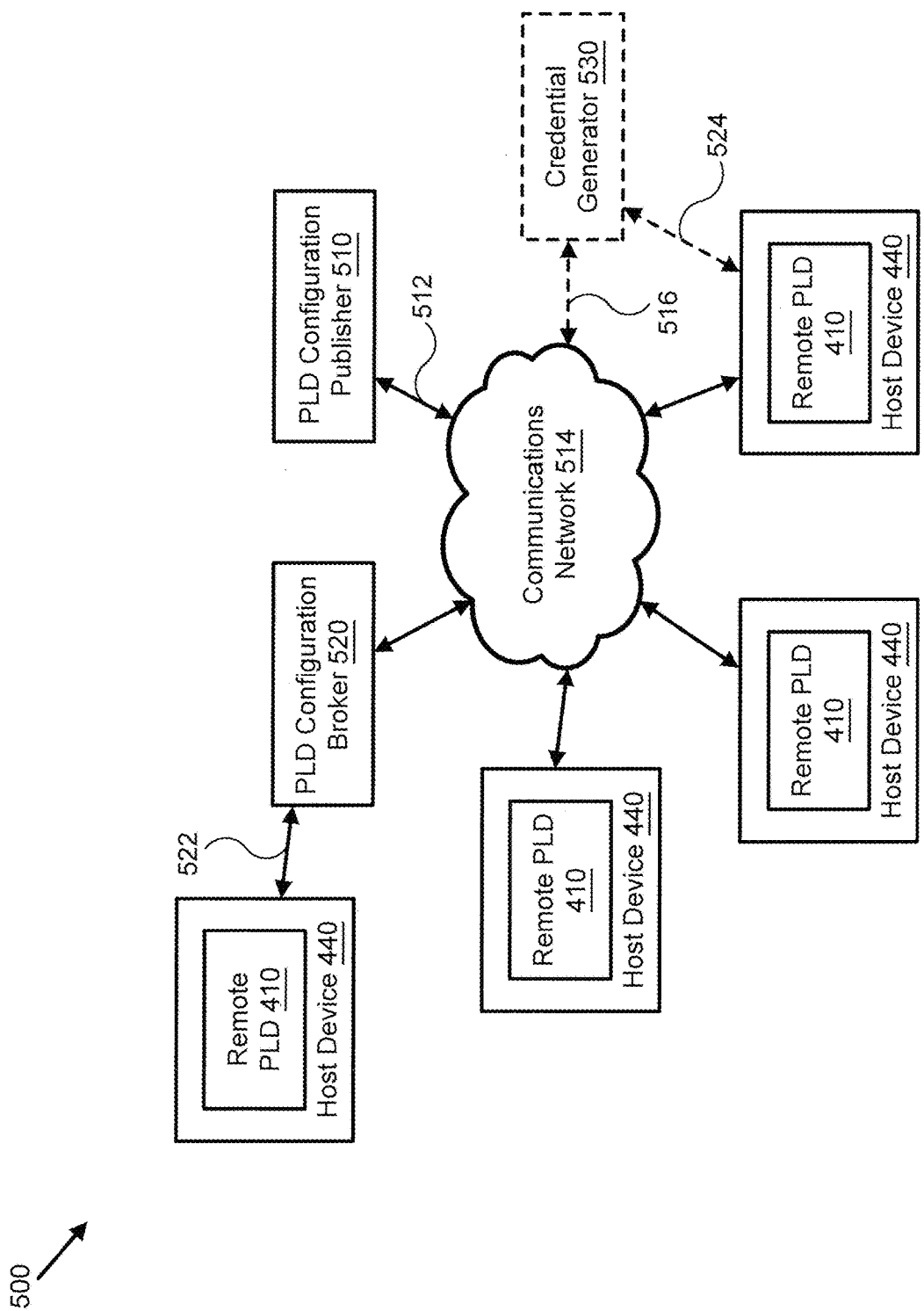
FIG. 5 illustrates a block diagram of a remote PLD management system in accordance with an embodiment of the disclosure.

FIG. 5 illustrates a block diagram of a remote PLD management system 500 in accordance with an embodiment of the disclosure. For example, one or more elements of management system 500 may be configured to perform at least portions of the management processes described in relation to FIGS. 6-7. In the embodiment shown in FIG. 5, remote PLD management system 500 includes PLD configuration publisher 510 and PLD configuration broker 520 configured to communicate with each other over communications links 512 and communications network 514. In general, communications links 512 may be implemented by one or more wired and/or wireless communications links configured to support data communications to and from communications network 514, and communications network 514 may be implemented by one or more local and/or wide area networks configured to support data communications generally (e.g., internet service providers, cellular networks, and/or the Internet). Each of the remaining elements or nodes of remote PLD management system 500 may generally be implemented as host devices 440 each similar in scope to host device 440 of FIG. 4 and including a remote PLD 410 configured to communicate across communications links 512 and communications network 514 or communications link 522 to PLD management system 500 and/or one or more elements of PLD management system 500, including PLD configuration broker 520.

In various embodiments, remote PLD management system 500 may be configured to manage provisioning, reprovisioning, debugging, telemetry reporting, and/or other operational aspects of host devices 440 associated with configuration images for remote PLDs 410 of host devices 440 and/or associated with various secure communication mechanisms for remote PLDs and/or host devices similar to remote PLD 410 and/or host device 440. For example, in some embodiments, management system 500 may include optional credential generator 530, which may be implemented as a user input device (e.g., smart phone, tablet computer, laptop computer, desktop computer) capable of forming indirect communications link 516 and/or direct communications link 524 to host device 440 to provide communication link credentials to host device 440 enabling host device 440 to establish communication links 512 to or through communications network 514 and/or communications link 522 to one or more elements or nodes of remote PLD management system 500, such as to PLD configuration broker 520 and/or PLD configuration publisher 510. Such communication link credentials may include wireless communication credentials, pre-shared TLS or other certificates, URL or other broker identifier associated with one or more elements or nodes of remote PLD management system 500, public or private keys associated with protected configuration images generated by PLD configuration publisher 510 and secured (encrypted and/or signed) by PLD configuration publisher 510 and/or PLD configuration broker 520, and/or other communication link credentials, as described herein.

PLD configuration publisher 510 may be implemented as one or more servers each with one or more processors and/or memories configured to generate protected configuration images for PLD fabric 400 of remote PLD 410 and/or associated with host device 440, similar to design process 300 of FIG. 3. PLD configuration publisher 510 may also be configured to provide such protected configuration images to each host device 440 and/or remote PLD 410 directly, for example, or to PLD configuration broker 520 for managed distribution to host devices 440. In some embodiments, PLD configuration publisher 510 may be configured to generate modified protected configuration images for PLD fabric 400 designed to identify, correct, and/or mitigate operational anomalies detected in the operation of remote PLD 410 and/or host device 440, as described herein.

PLD configuration broker 520 may be implemented as one or more servers each with one or more processors and/or memories configured to manage a group of remote PLDs 410 (e.g., embedded and/or integrated with host devices 440), as shown in FIG. 5. For example, PLD configuration broker 520 may be implemented as one or more broker instances running within a cloud computing infrastructure. In specific embodiments, PLD configuration broker 520 may be configured to receive operational alerts from remote PLD 410/host device 440, generate operational alert reports based on such operational alerts, and provide the operational alert reports to PLD configuration publisher 510. More generally, PLD configuration broker 520 may be configured to distribute protected configuration images to remote PLDs 410/host devices 440, for example, and according to various communications link credentials (e.g., provided by one or more of PLD configuration publisher 510, host devices 440, or credential generator 530).

In some embodiments, PLD configuration broker 520 may be implemented as a message queuing telemetry transport (MQTT) broker configured to perform various extended management operations according to a publish-subscribe messaging protocol (e.g., forward and filter), implemented over communications links 512 and/or 522 and/or communications network 514. For example, PLD configuration broker 520 may be configured to support hierarchical topics with corresponding hierarchical access permission sanctioning, for example, which may be tied to a particular device identifier (e.g., specific to a particular remote PLD and/or host device) or device category identifier (e.g., specific to a range or category of remote PLDs and/or host devices, such as those associated with a particular manufacturer, retailer, geographical region, and/or other range or category of devices). In some embodiments, PLD configuration broker 520 may be configured to support formation of encrypted communications tunnels (e.g., such as a TLS tunnel and/or certificate handling) between PLD configuration broker 520 and PLD configuration publisher 510, for example, and between PLD configuration broker 520 and one or more host devices 440.

In additional embodiments, PLD configuration broker 520 may be configured to provide compression and/or partitioning of protected configuration images in order to provide protected configuration images larger than 128 KB or 256 KB to host devices 440 over the MQTT protocol (e.g. and including various messaging size limitations). For example, PLD configuration broker 520 may be configured to provide message compression implemented as run length encoding of protected configuration images provided to host devices 440. In various embodiments, remote PLDs 410 and/or host devices 440 may be configured to receive such compressed and/or partitioned protected configuration image messages and reconstruct the protected configuration image using appropriate decoding processes and/or by storing the protected configuration image in NVM 420. In particular embodiments, PLD configuration broker 520 may be configured to provide various quality of service (QoS) features.

In some embodiments, either or both PLD configuration publisher 510 and PLD configuration broker 520 may be configured to provide a server based user interface (SBUI) configured to facilitate discovery and retention of host devices 440. For example, such SBUI may be configured to generate a statistics database including detailed communications information associated with host devices 440 and/or remote PLDs 410, such as logs of discoveries (e.g., by device identifier, device category identifier, MAC address, time of communication, and/or other communication log information), downloads of protected configuration images, and/or other communications information associated with management system 500. In various embodiments, PLD configuration publisher 510 and PLD configuration broker 520 may be integrated with each other.

More generally, remote PLD management system 500 may omit PLD configuration broker 520 and be configured to use PLD configuration publisher 510 and/or other nodes of remote PLD management system 500 to perform various management operations without reliance upon a broker architecture. For example, remote PLD management system 500 and/or various nodes of remote PLD management system 500 may be configured to receive operational alerts from remote PLD 410/host device 440, generate operational alert reports based on such operational alerts, and/or provide the operational alert reports to any other element of remote PLD management system 500. More generally, remote PLD management system 500 may be configured to distribute protected configuration images to remote PLDs 410/host devices 440, for example, and according to various communications link credentials (e.g., provided by one or more of PLD configuration publisher 510, remote PLDs 410, host devices 440, or credential generator 530).

In some embodiments, remote PLD management system 500 may be configured to perform various extended management operations according to a variety of different messaging protocols and/or architectures, including Hypertext Transfer Protocol (HTTP), Hypertext Transfer Protocol Secure (HTTPS), MQTT, Advanced Message Queuing Protocol (AMQP), Constrained Application Protocol (CoAP), Extensible Messaging Presence Protocol (XMPP), Representational State Transfer (REST), RabbitMQ, Google Cloud, Kafka, ZeroMQ, gRPC, simple queue service (SQS), and/or a variety of different publish-subscribe messaging protocols (e.g., forward and filter), each of which may or may not include or require implementation of a messaging broker or instance, and each of which may be implemented over communications links 512 and/or 522 and/or communications network 514. For example, remote PLD management system 500 may be configured to support hierarchical topics with corresponding hierarchical access permission sanctioning, for example, which may be tied to a particular device identifier (e.g., specific to a particular remote PLD and/or host device) or device category identifier (e.g., specific to a range or category of remote PLDs and/or host devices, such as those associated with a particular manufacturer, retailer, geographical region, and/or other range or category of devices). In some embodiments, remote PLD management system 500 may be configured to support formation of encrypted communications tunnels (e.g., such as a TLS tunnel and/or certificate handling) between any element of remote PLD management system 500 and one or more host devices 440.

In additional embodiments, remote PLD management system 500 may be configured to provide compression and/or partitioning of protected configuration images in order to provide protected configuration images larger than 128 KB or 256 KB to host devices 440 over any selected protocol or protocols (e.g. and including various messaging size limitations). For example, remote PLD management system 500 may be configured to provide message compression implemented as run length encoding of protected configuration images provided to host devices 440. In various embodiments, remote PLDs 410 and/or host devices 440 may be configured to receive such compressed and/or partitioned protected configuration image messages and reconstruct the protected configuration image using appropriate decoding processes and/or by storing the protected configuration image in an NVM within remote PLD 410 and/or host device 440 (e.g., NVM 420). In particular embodiments, remote PLD management system 500 may be configured to provide various quality of service (QoS) features.

In some embodiments, remote PLD management system 500 may be configured to provide a server based user interface (SBUI) configured to facilitate discovery and retention of host devices 440. For example, such SBUI may be configured to generate a statistics database including detailed communications information associated with host devices 440 and/or remote PLDs 410, such as logs of discoveries (e.g., by device identifier, device category identifier, MAC address, time of communication, and/or other communication log information), downloads of protected configuration images, and/or other communications information associated with remote PLD management system 500.

Figure 6:
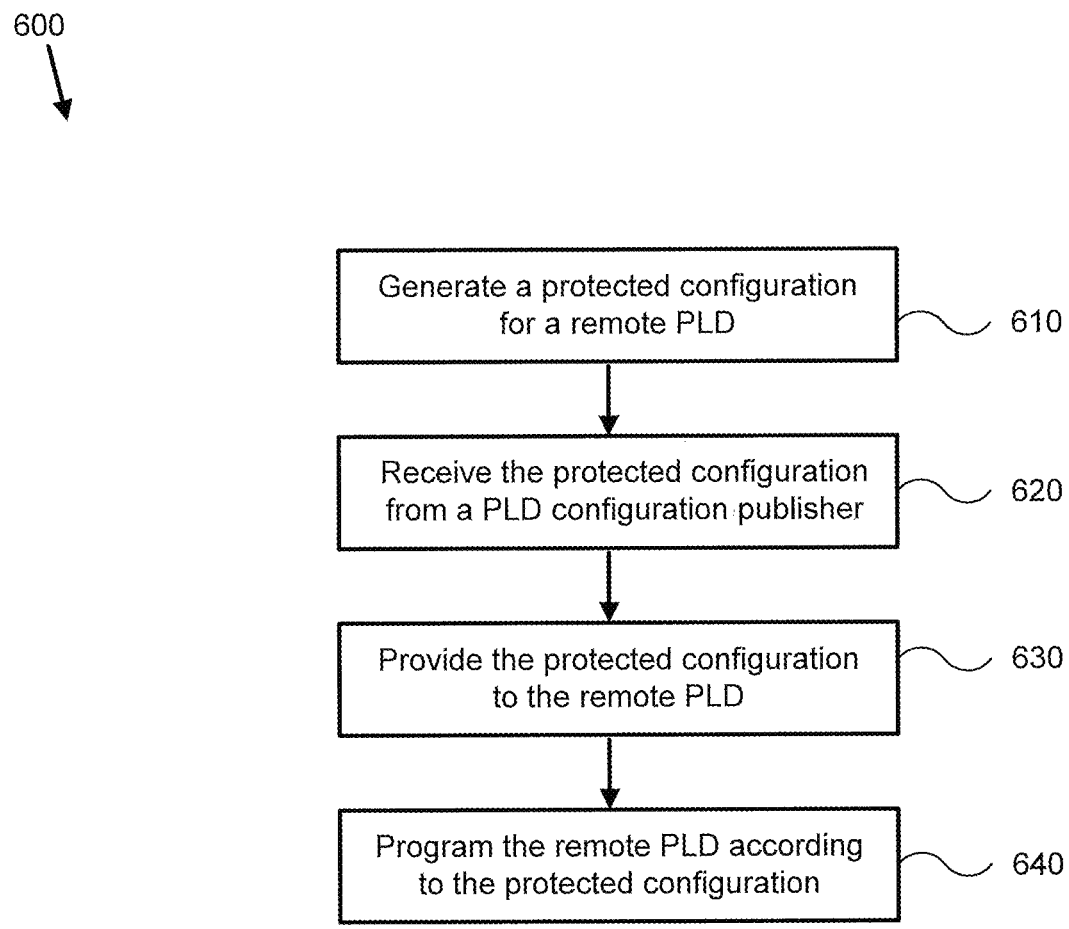
FIG. 6 illustrates a management process for a remote PLD integrated with a host device in accordance with an embodiment of the disclosure.

FIG. 6 illustrates a management process for a remote PLD integrated with a host device in accordance with an embodiment of the disclosure. In some embodiments, the operations of FIG. 6 may be implemented as software instructions executed by one or more logic devices associated with corresponding electronic devices, modules, and/or structures depicted in FIGS. 1-5. More generally, the operations of FIG. 6 may be implemented with any combination of software instructions and/or electronic hardware (e.g., inductors, capacitors, amplifiers, actuators, or other analog and/or digital components). It should be appreciated that any step, sub-step, sub-process, or block of process 600 may be performed in an order or arrangement different from the embodiments illustrated by FIG. 6. For example, in other embodiments, one or more blocks may be omitted from process 600, and other blocks may be included. Furthermore, block inputs, block outputs, various sensor signals, sensor information, calibration parameters, and/or other operational parameters may be stored to one or more memories prior to moving to a following portion of process 600. Although process 600 is described with reference to systems, devices, and elements of FIGS. 1-5, process 600 may be performed by other systems, devices, and elements, and including a different selection of electronic systems, devices, elements, assemblies, and/or arrangements. At the initiation of process 600, various system parameters may be populated by prior execution of a process similar to process 600, for example, or may be initialized to zero and/or one or more values corresponding to typical, stored, and/or learned values derived from past operation of process 600, as described herein.

In block 610, a logic device generates a protected configuration for a remote PLD. For example, PLD configuration publisher 510 and/or external system 130 may be configured to generate a protected configuration image for remote PLD 410 of user interface 440. In various embodiments, such configuration image may be generated based, at least in part, on a device identifier and/or a device category identifier corresponding to remote PLD 410 residing in PLD configuration publisher 510 or external system 130, in NVM 420 of remote PLD 410, in PLD configuration broker 520, and/or in other nodes of remote PLD management system 500. In some embodiments, such configuration image may be protected by encrypting and/or signing the configuration image using public key encryption techniques, for example, where the appropriate private/public key pairs reside in PLD configuration publisher 510 or external system 130 and in NVM 420 of remote PLD 410, and where public keys are stored before remote PLD 410 is deployed or exchanged over communications links 512 or 514 and/or communications network 514 after host device 440 is deployed. In other embodiments, such configuration image may be protected by encrypting the configuration image with a symmetric key stored/residing in both PLD configuration publisher 510 or external system 130 and in NVM 420 of remote PLD 410. In various embodiments, such encrypting and/or signing may be performed, at least in part, by PLD configuration broker 520 and/or by other nodes of remote PLD management system 500.

In block 620, a logic device receives a protected configuration from a PLD configuration publisher. For example, PLD configuration broker 520 may be configured to receive a protected configuration image for remote PLD 410 of host device 440 from PLD configuration publisher 510. In some embodiments, PLD configuration publisher 510 and/or PLD configuration broker 520 may be configured to establish a communications link 512 over communications network 514 and between each other, for example, and communicate the protected configuration image over such communications link (e.g., PLD configuration publisher 510 may provide the protected configuration image to PLD configuration broker 520). In specific embodiments, communications link 512 may be implemented as a secure communications link, such as a TLS communications link or other encrypted communications tunnel established via key exchange over communications link 512, for example. In alternative embodiments, PLD configuration broker 520 may be configured to receive an unprotected configuration image and protect the configuration using one or more of the protection techniques described with respect to block 610. In embodiments where remote PLD management system 500 lacks PLD configuration broker 520, process 600 may omit block 620, for example, or PLD configuration publisher 510 and/or other nodes of remote PLD management system 500 may be configured to receive and protect the configuration using one or more of the protection techniques described with respect to block 610, which may be layered over the protection provided in block 610.

In block 630, a logic device provides a protected configuration to a remote PLD. For example, PLD configuration broker 520 may be configured to provide the protected configuration image received and/or received and protected in block 620 to remote PLD 410 of host device 440 via communication module 450. In some embodiments, host device 440 and/or remote PLD 410 may be configured to form communications link 512 and/or 522 with PLD configuration broker 520 over communications network 514 via communication module 450 of host device 440. For example, forming such communications link may include remote PLD 410 controlling a communication module (e.g., communication module 450) via programmable I/O 404 and/or buses 402 and/or 408 to enter a hotspot mode to allow credential generator 530 to provide communications link credentials (e.g., over indirect communications link 516 and/or direct communications link 524) to form communications link 512 and/or 522 over or to communications network 514, and thereby, to PLD configuration broker 520. Forming such communications link may include remote PLD 410 controlling communication module 450 to establish an encrypted communications tunnel over such communication link. Upon formation of such communications link, remote PLD 410 of host device 440 may be configured to receive the protected configuration image from PLD configuration broker 520, as described herein. In embodiments where remote PLD management system 500 lacks PLD configuration broker 520, PLD configuration publisher 510 and/or other nodes of remote PLD management system 500 may be configured to provide the protected configuration to remote PLD 410 of host device 440 via a communication module accessible by remote PLD 410 and/or according to the communications link formation protocols described herein.

In block 640, a logic device programs a remote PLD according to a protected configuration. For example, remote PLD 410 may be configured to program PLD fabric 400 and/or NVM 420 of remote PLD 410 according to the protected configuration image (e.g., generated by PLD configuration publisher 510 in block 610) provided by an element of remote PLD management system 500, including PLD configuration broker 520, and received by remote PLD 410 in block 630, similar to the programming process described with respect to design process 300 of FIG. 3. In various embodiments, host device 440 and/or remote PLD 410 may be configured to store the protected configuration image in NVM 420 of remote PLD 410 and/or couple the protected configuration image provided by communication module 520 through programmable I/O 404 of remote PLD 410 to PLD fabric 400 (e.g., via buses 408 and/or 402), as described herein.

In some embodiments, host device 440 and/or remote PLD 410 may be configured to authenticate such protected configuration image prior to programming PLD fabric 400. In one embodiment, where the protected configuration image is signed using a private key associated with PLD configuration publisher 510 (e.g., signed by PLD configuration publisher 510, PLD configuration broker 520, and/or some other element of remote PLD management system 500), a corresponding public key may be stored in NVM 420 of remote PLD 410, and the authenticating may include using the public key to verify that the protected configuration image is signed using the private key associated with PLD configuration publisher 510. In another embodiment, where the protected configuration image includes a device identifier and/or a device category identifier associated with remote PLD 410, the device identifier and/or the device category identifier may be stored in NVM 420 of remote PLD 410, and the authenticating may include comparing the device identifier and/or the device category identifier of the protected configuration image with the device identifier and/or the device category identifier stored in NVM 420. Symmetric or asymmetric decryption may also be performed after such authentication has occurred.

Figure 7:
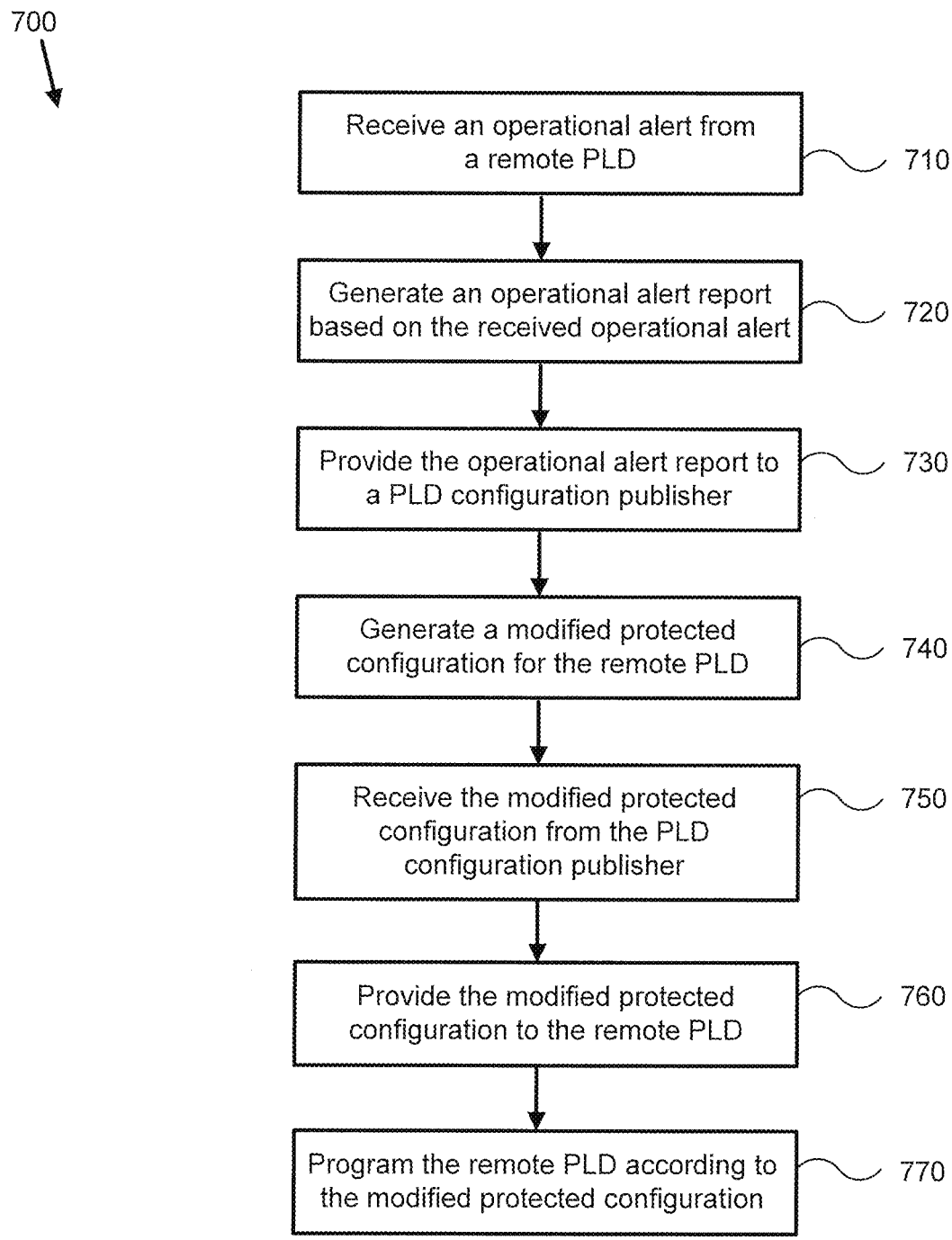
FIG. 7 illustrates a management process for a remote PLD integrated with a host device in accordance with an embodiment of the disclosure.

FIG. 7 illustrates a management process for a remote PLD integrated with a host device in accordance with an embodiment of the disclosure. In some embodiments, the operations of FIG. 7 may be implemented as software instructions executed by one or more logic devices associated with corresponding electronic devices, modules, and/or structures depicted in FIGS. 1-5. More generally, the operations of FIG. 7 may be implemented with any combination of software instructions and/or electronic hardware (e.g., inductors, capacitors, amplifiers, actuators, or other analog and/or digital components). It should be appreciated that any step, sub-step, sub-process, or block of process 700 may be performed in an order or arrangement different from the embodiments illustrated by FIG. 7. For example, in other embodiments, one or more blocks may be omitted from process 700, and other blocks may be included. Furthermore, block inputs, block outputs, various sensor signals, sensor information, calibration parameters, and/or other operational parameters may be stored to one or more memories prior to moving to a following portion of process 700. Although process 700 is described with reference to systems, devices, and elements of FIGS. 1-5, process 700 may be performed by other systems, devices, and elements, and including a different selection of electronic systems, devices, elements, assemblies, and/or arrangements. At the initiation of process 700, various system parameters may be populated by prior execution of a process similar to process 700, for example, or may be initialized to zero and/or one or more values corresponding to typical, stored, and/or learned values derived from past operation of process 700, as described herein.

In block 710, a logic device receives an operational alert from a remote PLD. For example, PLD configuration publisher 410, PLD configuration broker 520, and/or other nodes of remote PLD management system 500 may be configured to receive an operational alert from remote PLD 410 (e.g., via communication module 450) that corresponds to an operational anomaly associated with PLD fabric 400. In some embodiments, remote PLD 410 and/or host device 440 may be configured to detect the operational anomaly associated with PLD fabric 400 (e.g., using one or more other IC modules 406 and/or other host device modules 460), generate the operational alert based, at least in part, on the detected operational anomaly and/or telemetry data associated with operation of remote PLD 410 and/or the detected operational anomaly, and provide the operational alert to PLD configuration publisher 410, PLD configuration broker 520, and/or other nodes of remote PLD management system 500 via communications links 512 and/or 514 established using communication module 450, for example, as described herein. Such operational anomaly may include, for example, an unexpected reboot, unexpected data from a sensor element, unexpected data generated by computation, and/or other operational anomalies associated with operation of remote PLD 410 and/or host device 440. In various embodiments, an operational alert may include debug information associated with such detected operational anomaly, which may be generated by PLD fabric 400 configured according to a particular configuration image, for example, and stored in NVM 420.

In alternative embodiments, PLD configuration publisher 410, PLD configuration broker 520, and/or other nodes of remote PLD management system 500 may be configured to issue a check status command to remote PLD 410, such as prior receiving an operational alert, for example, or prior to receiving an operational confirmation from remote PLD 410. Such operational confirmation may be configured to convey lack of an operational anomaly, such as telemetry data indicating a normal or expected operational state for remote PLD 410, to PLD configuration publisher 410, PLD configuration broker 520, and/or other nodes of remote PLD management system 500 via communications links 512 and/or 514 established using communication module 450, as described herein. In various embodiments, PLD configuration publisher 410, PLD configuration broker 520, and/or other nodes of remote PLD management system 500 may be configured to periodically poll one or more remote PLDs 410 and/or include logs of operational alerts and/or operational confirmations (e.g., cross referenced by date and time/time stamps of such alerts/anomalies/confirmations, for example) in an operational alert report.

In block 720, a logic device generates an operational alert report based on a received operational alert. For example, PLD configuration publisher 410, PLD configuration broker 520, and/or other nodes of remote PLD management system 500 may be configured to generate an operational alert report based, at least in part, on the operational alert and/or the operational confirmation provided by remote PLD 410 and received by PLD configuration publisher 410, PLD configuration broker 520, and/or other nodes of remote PLD management system 500 in block 710. In some embodiments, such operational alert report may include any or all information (e.g., debug information) included in the received operational alert and/or operational confirmation. In other embodiments, PLD configuration publisher 410, PLD configuration broker 520, and/or other nodes of remote PLD management system 500 may be configured to aggregate multiple operational alerts provided by one or more remote PLDs 410 and/or host devices 440 into a single operational alert report. In further embodiments, PLD configuration publisher 410, PLD configuration broker 520, and/or other nodes of remote PLD management system 500 may be configured to include additional management data associated with such operational alerts and/or operational confirmations, such as time of receipt, device identifier or device category identifier, topic and/or subtopic associated with each operational alert and/or operational confirmation, a listing of all topics and/or subtopics subscribed to by the remote PLD providing the operational alert and/or the operational confirmation and/or provided by PLD configuration publisher 410, PLD configuration broker 520, and/or other nodes of remote PLD management system 500, and/or additional management data, as described herein.

In block 730, a logic device provides an operational alert report to a PLD configuration publisher. For example, PLD configuration broker 520 and/or other nodes of remote PLD management system 500 may be configured to provide the operational alert report generated in block 720 to PLD configuration publisher 510 over communications links 512 and/or communications network 514.

In block 740, a logic device generates a modified protected configuration for a remote PLD. For example, PLD configuration publisher 510 may be configured to receive the operational alert report provided by PLD configuration publisher 410, PLD configuration broker 520, and/or other nodes of remote PLD management system 500 in block 730 and to generate a modified protected configuration image for PLD fabric 400 based, at least in part, on the operational alert report and a device identifier and/or a device category identifier corresponding to remote PLD 410 (e.g., for authentication and verification purposes). In various embodiments, the modified protected configuration image may be configured to identify, correct, and/or mitigate the operational anomaly detected by remote PLD 410 in block 710. For example, in some embodiments, the modified protected configuration image may be configured to generate additional or directed debug information associated with the detected operational anomaly and to be stored in NVM 420, to enable or disable functionality of remote PLD 410 and/or host device 440, and/or to generate a visible or audible alert to a user (e.g., via other host device module 460) to notify the user to replace remote PLD 410 and/or host device 440 or otherwise manually mitigate the detected operational anomaly. Once such modified protected configuration image is generated, PLD configuration publisher 510 may be configured to provide the modified protected configuration image to PLD configuration broker 520 and/or other nodes of remote PLD management system 500. More generally, block 740 may include any of the operations described with respect to block 610 of process 600 in FIG. 6.

In block 750, a logic device receives a modified protected configuration from a PLD configuration publisher. For example, PLD configuration broker 520 and/or other nodes of remote PLD management system 500 may be configured to receive the modified protected configuration image generated in block 740 from PLD configuration publisher 510. In various embodiments, the modified protected configuration image may be based, at least in part, on the operational alert report generated in block 720. More generally, block 750 may include any of the operations described with respect to block 620 of process 600 in FIG. 6.

In block 760, a logic device provides a modified protected configuration to a remote PLD. For example, PLD configuration publisher 410, PLD configuration broker 520, and/or other nodes of remote PLD management system 500 may be configured to provide the modified protected configuration received in block 750 to remote PLD 410 and/or host device 440 via communication module 450. More generally, block 760 may include any of the operations described with respect to block 630 of process 600 in FIG. 6.

In block 770, a logic device programs a remote PLD according to a modified protected configuration. For example, remote PLD 410 and/or host device 440 may be configured to receive the modified protected configuration provided by PLD configuration publisher 410, PLD configuration broker 520, and/or other nodes of remote PLD management system 500 in block 760 and program PLD fabric 400 according to the modified protected configuration image. In various embodiments, the modified protected configuration image may be configured to identify, correct, and/or mitigate the operational anomaly detected in block 710, a described herein. In some embodiments, the modified protected configuration image may be stored in NVM 420 of remote PLD 410 and/or coupled through programmable I/O 408 of remote PLD 410 to PLD fabric 400. More generally, block 770 may include any of the operations described with respect to block 640 of process 600 in FIG. 6. Upon the completion of such programming, remote PLD 410 may reboot and/or operate according to the modified protected configuration.

Thus, by employing the systems and methods described herein, embodiments of the present disclosure are able to provide flexible and secure management for a remote PLD. A remote PLD of a host device may be securely updated, debugged, and/or otherwise managed without risking exposure of customer data and with minimal need for user intervention. Moreover, the remote PLD may be securely re-provisioned according to updated customer data, for example, or according to a new customer application, without requiring the remote PLD be returned to a manufacturer.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into substeps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A remote programmable logic device (remote PLD) management system, the system comprising:

a remote PLD comprising a plurality of programmable logic blocks (PLBs) arranged in a PLD fabric and a programmable input/output (I/O) coupled to the PLD fabric,
wherein the remote PLD is configured to perform a computer-implemented method comprising:
forming a communications link between the remote PLD and a remote PLD management system node over a communications network via a communication module of the remote PLD or a host device configured to interface with the remote PLD over the programmable I/O, wherein the forming the communications link comprises subscribing to receive messages on one or more first topics via a publish-subscribe messaging protocol in which subscribers subscribe to topics with a PLD configuration broker, and a PLD configuration publisher publishes messages by sending messages and associated topics to the PLD configuration broker, wherein the topics are hierarchical topics corresponding to hierarchical permission access sanctioning tied to protected configuration images;
receiving a protected configuration image associated with one of the one or more first topics from the remote PLD management system node via the PLD configuration broker via the publish-subscribe messaging protocol over the communications link; and
programming the PLD fabric according to the protected configuration image, wherein the protected configuration image is stored in and/or retrieved from a non-volatile memory (NVM) of the remote PLD or the host device and/or coupled through the programmable I/O and/or an external interface of the remote PLD to the PLD fabric.

2. The remote PLD management system of claim 1, wherein the remote PLD management system node comprises the PLD configuration broker configured to:
receive the protected configuration image for the PLD fabric from the PLD configuration publisher of the remote PLD management system via the publish-subscribe messaging protocol; and
provide the protected configuration image to the remote PLD and/or the host device via the communications link via the publish-subscribe messaging protocol;
wherein the one or more first topics are associated with one or more identifiers corresponding to the hierarchical access permission sanctioning, wherein each of which identifies at least one of the following items pertinent to the remote PLD management system:
the host device;
the remote PLD;
a device category comprising the host device; and/or
a remote PLD category comprising the remote PLD.

3. The remote PLD management system of claim 2, further comprising the PLD configuration publisher, wherein the PLD configuration publisher is configured to:
generate the protected configuration image for the PLD fabric; and
provide the protected configuration image to the PLD configuration broker;
wherein the publish-subscribe messaging protocol comprises a message queuing telemetry transport (MQTT) protocol, and wherein the one or more first topics are associated with at least one of:
the identifier of the host device;
the identifier of the device category, wherein the identifier of the device category is associated with a manufacturer, a retailer, and/or a geographical region; and/or
the identifier of the remote PLD category, wherein the identifier of the remote PLD category is associated with a manufacturer, a retailer, and/or a geographical region.

4. The remote PLD management system of claim 1, wherein the computer-implemented method further comprises:
detecting an operational anomaly associated with the remote PLD and/or the host device;
generating an operational alert based, at least in part, on the detected operational anomaly;
providing the operational alert to the remote PLD management system node;
receiving a modified protected configuration image from the remote PLD management system node, wherein the modified protected configuration image is configured to identify, correct, and/or mitigate the detected operational anomaly; and
programming the PLD fabric according to the modified protected configuration image, wherein the modified protected configuration image is stored in the NVM of the remote PLD or the host device and/or coupled through the programmable I/O and/or an external interface of the remote PLD to the PLD fabric.

5. The remote PLD management system of claim 4, wherein the remote PLD management system node comprises a PLD configuration broker configured to:
receive the operational alert from the remote PLD via the communication module;
generate an operational alert report based, at least in part, on the received operational alert;
provide the operational alert report to a PLD configuration publisher;
receive the modified protected configuration image for the remote PLD from the PLD configuration publisher, wherein the modified protected configuration image is based, at least in part, on the operational alert report; and
provide the modified protected configuration image to the remote PLD and/or the host device via the communication module.

6. The remote PLD management system of claim 5, further comprising the PLD configuration publisher, wherein the PLD configuration publisher is configured to:
receive the operational alert report from the PLD configuration broker;
generate the modified protected configuration image for the PLD fabric based, at least in part, on the operational alert report and a device identifier and/or a device category identifier corresponding to the remote PLD; and
provide the modified protected configuration image to the PLD configuration broker.

7. The remote PLD management system of claim 1, wherein the computer-implemented method further comprises:
generating an operational alert based, at least in part, on telemetry data associated with operation of the remote PLD and/or the host device; and
providing the operational alert to the remote PLD management system node.

8. The remote PLD management system of claim 7, wherein the computer-implemented method further comprises:
receiving a check status command from the remote PLD management system node prior to the generating the operational alert mode, wherein the receiving the check status command triggers the generating the operational alert, and wherein the operational alert comprises an operational confirmation configured to indicate lack of an operational anomaly associated with the remote PLD and/or the host device.

9. A method for managing a remotely programmable, programmable logic device (remote PLD), the method comprising:
forming a communications link between the remote PLD and a remote PLD management system node of a remote PLD management system over a communications network via a communication module of the remote PLD or a host device configured to interface with the remote PLD over a programmable input/output (I/O) of the remote PLD;
receiving a protected configuration image from the remote PLD management system node over the communications link, wherein the forming the communications link comprises subscribing to receive messages on one or more first topics via a publish-subscribe messaging protocol in which subscribers subscribe to topics with a PLD configuration broker, and a PLD configuration publisher publishes messages by sending messages and associated topics to the PLD configuration broker, wherein the topics are hierarchical topics corresponding to hierarchical permission access sanctioning tied to protected configuration images; and
programming a PLD fabric of the remote PLD according to the protected configuration image, wherein the protected configuration image is stored in and/or retrieved from a non-volatile memory (NVM) of the remote PLD or the host device and/or coupled through the programmable I/O and/or an external interface of the remote PLD to the PLD fabric.

10. The method of claim 9, wherein the remote PLD management system node comprises a PLD configuration broker, the method further comprising:
receiving, by the PLD configuration broker via the publish-subscribe messaging protocol, the protected configuration image for the PLD fabric from the PLD configuration publisher of the remote PLD management system; and
providing the protected configuration image to the remote PLD and/or the host device via the communications link via the publish-subscribe messaging protocol;
wherein the one or more first topics are associated with one of more identifiers corresponding to the hierarchical access permission sanctioning, wherein each of which identifies at least one of the following items pertinent to the remote PLD management system:
the host device;
the remote PLD;
a device category comprising the host device; and/or
a remote PLD category comprising the remote PLD.

11. The method of claim 10, further comprising:
generating, by the PLD configuration publisher, the protected configuration image for the PLD fabric; and
providing the protected configuration image to the PLD configuration broker;

wherein the publish-subscribe messaging protocol comprises a message queuing telemetry transport (MQTT) protocol, and wherein the one or more first topics comprise at least one of:
the identifier of the host device;
the identifier of the device category, wherein the identifier of the device category is associated with a manufacturer, a retailer, and/or a geographical region; and/or
the identifier of the remote PLD category, wherein the identifier of the remote PLD category is associated with a manufacturer, a retailer, and/or a geographical region.

12. The method of claim 9, further comprising:
detecting an operational anomaly associated with the remote PLD and/or the host device;
generating an operational alert based, at least in part, on the detected operational anomaly;
providing the operational alert to the remote PLD management system node;
receiving a modified protected configuration image from the remote PLD management system node, wherein the modified protected configuration image is configured to identify, correct, and/or mitigate the detected operational anomaly; and
programming the PLD fabric according to the modified protected configuration image, wherein the modified protected configuration image is stored in the NVM of the remote PLD or the host device and/or coupled through the programmable I/O and/or an external interface of the remote PLD to the PLD fabric.

13. The method of claim 12, wherein the remote PLD management system node comprises the PLD configuration broker, the method further comprising:
issuing, by the PLD configuration publisher and/or the PLD configuration broker, a check status command for the remote PLD and/or receiving, by the PLD configuration broker, the operational alert from the remote PLD via the communication module;
generating an operational alert report based, at least in part, on the received operational alert;
providing the operational alert report to a PLD configuration publisher;
receiving a modified protected configuration image for the remote PLD from the PLD configuration publisher, wherein the modified protected configuration image is based, at least in part, on the operational alert report; and
providing the modified protected configuration image to the remote PLD and/or the host device via the communication module.

14. The method of claim 13, further comprising:
receiving, by the PLD configuration publisher, the operational alert report from the PLD configuration broker;
generating the modified protected configuration image for the PLD fabric based, at least in part, on the operational alert report and a device identifier and/or a device category identifier corresponding to the remote PLD; and
providing the modified protected configuration image to the PLD configuration broker.

15. The method of claim 9, further comprising:
receiving a check status command from the remote PLD management system node after the forming the communications link;

generating an operational alert based, at least in part, on telemetry data associated with operation of the remote PLD and/or the host device; and
providing the operational alert to the remote PLD management system node over the communications link prior to the receiving the protected configuration image.

16. The method of claim 9, further comprising:
authenticating the received protected configuration image prior to the programming the PLD fabric, wherein the protected configuration image is signed using a private key associated with a PLD configuration publisher, a corresponding public key is stored in the NVM of the remote PLD, and the authenticating comprises using the public key to verify that the protected configuration image is signed using the private key associated with the PLD configuration publisher.

17. The method of claim 9, further comprising:
authenticating the received protected configuration image prior to the programming the PLD fabric, wherein the protected configuration image comprises a device identifier and/or a device category identifier associated with the remote PLD, the device identifier and/or the device category identifier is stored in the NVM of the remote PLD, and the authenticating comprises comparing the device identifier and/or the device category identifier of the protected configuration image with the device identifier and/or the device category identifier stored in the NVM of the remote PLD.

18. A method for managing a remotely programmable, programmable logic device (remote PLD), the method comprising:
generating, by the remote PLD, an operational alert based, at least in part, on an operational anomaly associated with the remote PLD and/or a host device configured to interface with the remote PLD over a programmable input/output (I/O) of the remote PLD and/or on telemetry data associated with operation of the remote PLD and/or the host device;
forming a communications link between the remote PLD and a remote PLD management system node of a remote PLD management system over a communications network via a communication module of the remote PLD or the host device, wherein the forming the communications link comprises subscribing to receive messages on one or more first topics via a publish-subscribe messaging protocol in which subscribers subscribe to topics with a PLD configuration broker, and a PLD configuration publisher publishes messages by sending messages and associated topics to the PLD configuration broker, wherein the topics are hierarchical topics corresponding to hierarchical permission access sanctioning tied to protected configuration images; and
providing the operational alert to the remote PLD management system node over the formed communications link.

19. The method of claim 18, wherein the publish-subscribe messaging protocol comprises a message queuing telemetry transport (MQTT) protocol, and wherein the operational alert is based, at least in part, on the operational anomaly associated with the remote PLD and/or the host device, the method further comprising:
detecting the operational anomaly associated with the remote PLD and/or the host device prior to the generating the operational alert;
receiving a protected configuration image from the remote PLD management system node, wherein the protected configuration image is configured to identify, correct, and/or mitigate the detected operational anomaly; and
programming a PLD fabric of the remote PLD according to the protected configuration image, wherein the protected configuration image is stored in and/or retrieved from a non-volatile memory (NVM) of the remote PLD or the host device and/or coupled through the programmable I/O and/or an external interface of the remote PLD to the PLD fabric.

20. The method of claim 18, wherein the operational alert is based, at least in part, on telemetry data associated with operation of the remote PLD and/or the host device, the method further comprising:
receiving a check status command from the remote PLD management system node prior to the generating the operational alert mode, wherein the receiving the check status command triggers the generating the operational alert.

* * * * *

UNITED STATES PATENT AND TRADEMARK OFFICE
CERTIFICATE OF CORRECTION

Page 1 of 1

PATENT NO. : 12,314,648 B2
APPLICATION NO. : 17/614316
DATED : May 27, 2025
INVENTOR(S) : Rahulkumar Koche, Satwant Singh and Bertrand Leigh It is certified that error appears in the above-identified patent and that said Letters Patent is hereby corrected as shown below:

In the Specification

In the CROSS REFERENCE TO RELATED APPLICATIONS:

Column 1, Line 12, change "claims the benefit" to --which claims the benefit--.

Signed and Sealed this
Fifteenth Day of July, 2025

Coke Morgan Stewart
*Acting Director of the United States Patent and Trademark Office*